United States Patent
Krupyshev

(10) Patent No.: US 6,944,517 B2
(45) Date of Patent: Sep. 13, 2005

(54) SUBSTRATE APPARATUS CALIBRATION AND SYNCHRONIZATION PROCEDURE

(75) Inventor: Alexander G. Krupyshev, Chelmsford, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 240 days.

(21) Appl. No.: 10/613,697

(22) Filed: Jul. 3, 2003

(65) Prior Publication Data

US 2005/0004697 A1 Jan. 6, 2005

(51) Int. Cl.[7] .............................................. G06F 19/00
(52) U.S. Cl. ........................ 700/114; 700/121; 700/245
(58) Field of Search ................................. 700/114, 121, 700/245; 414/744

(56) References Cited

U.S. PATENT DOCUMENTS

| | | | | |
|---|---|---|---|---|
| 4,951,601 A | * | 8/1990 | Maydan et al. ............. 118/719 |
| 5,102,280 A | * | 4/1992 | Poduje et al. ............. 414/744.5 |
| 5,931,626 A | * | 8/1999 | Theriault ..................... 414/217 |
| 6,195,619 B1 | * | 2/2001 | Ren ............................ 702/155 |
| 6,327,512 B1 | * | 12/2001 | Hirata et al. ................ 700/114 |
| 6,459,947 B1 | * | 10/2002 | Hirata et al. ................ 700/114 |

* cited by examiner

*Primary Examiner*—Leo Picard
*Assistant Examiner*—Sheela S. Rao
(74) *Attorney, Agent, or Firm*—Richard Pickreign, Esq.; Perman & Green, LLP

(57) ABSTRACT

A method for positioning substrates in a substrate processing apparatus having a substrate alignment device, a first substrate transport apparatus and a second substrate transport apparatus, includes calibrating the substrate alignment device with a motion of the first substrate transport apparatus, and calibrating a coordinate system of the second substrate transport apparatus with the substrate alignment device.

31 Claims, 11 Drawing Sheets

SUBSTRATE APPARATUS CALIBRATION AND SYNCHRONIZATION PROCEDURE

BACKGROUND OF THE INVENTION

1. Field of the Invention

The present invention relates to a substrate processing system and, more particularly, to the calibration and synchronization of components of the system.

2. Brief Description of Related Developments

Substrate processing equipment is typically capable of performing multiple operations on a substrate. U.S. Pat. No. 4,951,601 discloses a substrate processing apparatus with multiple processing chambers and a substrate transport apparatus. The substrate transport apparatus moves substrates among the processing chambers where different operations, such as sputtering, etching, coating, soaking, etc., are performed. Production processes used by semiconductor device manufacturers and material producers often require precise positioning of substrates in the substrate processing equipment. U.S. Pat. No. 5,931,626 discloses that a substrate transport robot may be taught the locations of the processing chambers and other components of the substrate processing system by providing the robot with the dimensions of the system and the components relative to the robot. One method of providing these dimensions is to manually move the end effectors of the robot to specific locations, record the movements, and "playback" the movements during processing operations.

However, this method of determining the locations of the system components is error prone. Measurement of the system dimensions and manual manipulations of the robot may be subject to human error. The precise location of system components may change slightly due to environmental changes, for example temperature and humidity fluctuations that may cause dimensional changes in parts of the system. In addition, seals, support structures, and other parts of the system may be subject to various types of stress, such as compression, and may change shape slightly over time in response. These factors, separately or in any combination, may affect the positioning of substrates within the substrate processing system.

It would be beneficial to provide a technique to correct for errors and changes in component locations, and to provide for more exact positioning of substrates in substrate processing equipment.

SUMMARY OF THE INVENTION

In one embodiment of the present invention, a method for positioning substrates in a substrate processing apparatus having a substrate alignment device, a first substrate transport apparatus and a second substrate transport apparatus includes calibrating the substrate alignment device with a motion of the first substrate transport apparatus, and calibrating a coordinate system of the second substrate transport apparatus with the substrate alignment device.

In another embodiment, a computer program product includes a computer useable medium having computer readable code embodied therein for causing a computer to position substrates in a substrate processing apparatus. The computer readable code includes code for causing a computer to calibrate a substrate alignment device with a motion of a first substrate transport apparatus, and code for causing a computer to calibrate a coordinate system of a second substrate transport apparatus with the substrate alignment device.

BRIEF DESCRIPTION OF THE DRAWINGS

The foregoing aspects and other features of the invention are explained in the following description, taken in connection with the accompanying drawings, wherein.

DETAILED DESCRIPTION OF THE EMBODIMENT(S)

Figure 1:
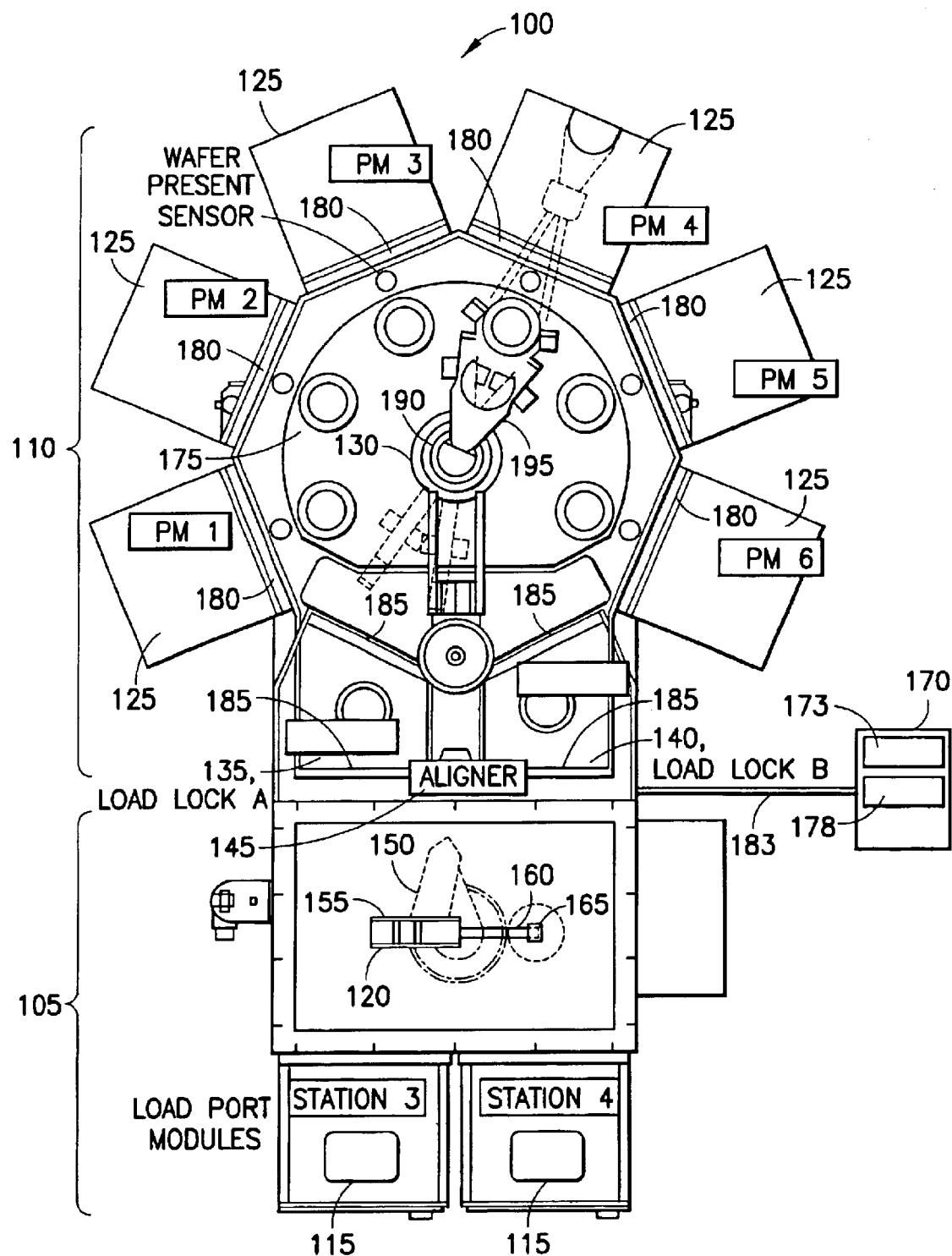
FIG. 1 is a schematic top plan view of a substrate apparatus incorporating the features of the present invention.

Referring to FIG. 1, there is shown a top view of a substrate processing apparatus 100 incorporating features of the present invention. Substrate processing apparatus 100 generally has an atmospheric section 105, which is open to the atmosphere, and an adjoining vacuum section 110, which is equipped to function as a vacuum chamber.

Atmospheric section 105 typically has one or more substrate holding cassettes 115, and an atmospheric substrate transport apparatus 120. Vacuum section 110 has one or more processing modules 125, and a vacuum substrate transport apparatus. 130. Vacuum section 110 also has one or more intermediate chambers, referred to as load locks. The embodiment shown in FIG. 1 has two load locks, load lock A 135, and load lock B 140. Load locks A and B operate as interfaces, allowing substrates to pass between atmospheric section 105 and vacuum section 110 without violating the integrity of any vacuum that may be present in vacuum section 110. Substrate processing apparatus 100 also includes a controller 170 that controls the operation of substrate processing apparatus 100. Controller 170 has a processor and a memory 178. Memory 178 may include operating system programs including a correction technique in accordance with the present invention.

As shown, controller 170 is connected to substrate processing system 100 through link 183. Link 183 may be any communications link capable of supporting communication between controller 170 and substrate processing system 100. Link 183 may include the PSTN, the internet, a wireless network, a wired network, and may further include other types of networks including X.25, TCP/IP, ATM, etc.

Controller 170 is generally adapted to read information from a computer program product, for example, a computer useable medium, or a program storage device, that may include computer readable code. The program storage device may include a diskette, a computer hard drive, a compact disk (CD), a digital versatile disk (DVD), an optical disk, a read only memory (ROM), a chip, a semiconductor, or any other device capable of storing computer readable code.

Atmospheric section 105 may have two substrate holding cassettes 115. Substrate holding cassettes 115 may be arranged in a generally side by side configuration. Substrate holding cassettes 115 may be front opening uniform pods (FOUP) which in one embodiment are capable of holding approximately 26 substrates. In alternate embodiments, atmospheric section 105 may support any desired number of substrate holding cassettes 115. Substrate holding cassettes 115 may be of any suitable type and be capable of holding any desired number of substrates.

For purposes of this invention a substrate may be for example, a semiconductor wafer (e.g. a 200 mm or 300 mm wafer), a flat panel display substrate, any other type of substrate suitable for processing by substrate processing apparatus 100, a blank substrate, or a article having characteristics similar to a substrate, such as certain dimensions or a particular mass.

Figure 2:
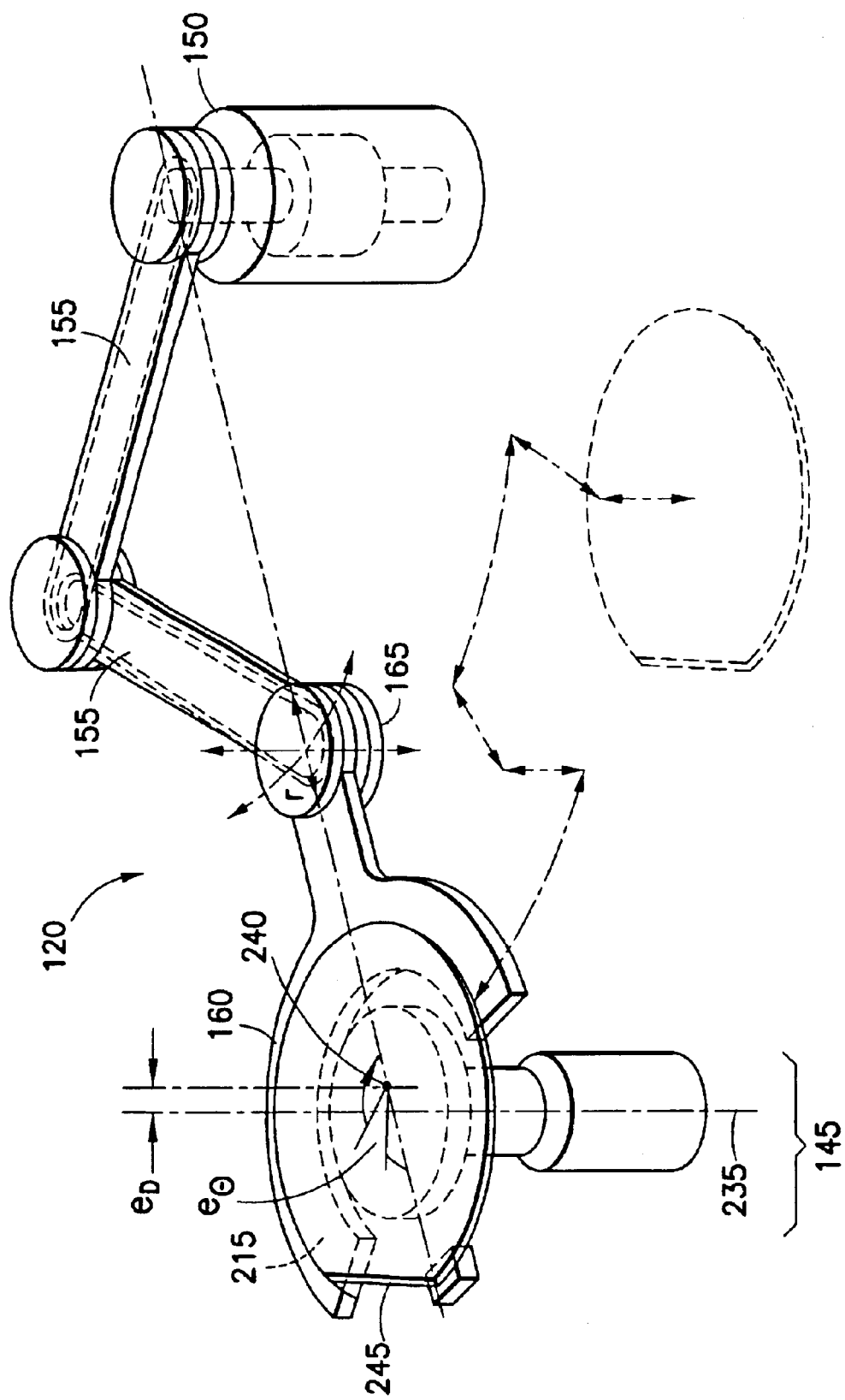
FIG. 2 is a diagrammatic perspective view of example embodiments of an aligner and an atmospheric substrate transport apparatus in accordance with the prior art.

Atmospheric substrate transport apparatus 120 is mounted to atmospheric section 105 between substrate holding cassettes 115 and vacuum section 110. Atmospheric substrate transport apparatus 120 may also be referred to as ATM robot 120. FIG. 2 shows one embodiment of ATM robot 120. ATM robot 120 has a drive section 150 and one or more arms 155. At least one arm 155 may be mounted onto drive section 150. At least one arm 155 is coupled to a wrist 160 which in turn is coupled to an end effector 165 for holding a substrate 215. End effector 165 is rotatably coupled to wrist 160.

Returning to FIG. 1, in an alternate embodiment, ATM robot 120 may be mounted on a carriage (not shown) movably attached to atmospheric section 105 so that ATM robot 120 may translate longitudinally or laterally relative to atmospheric section 105. ATM robot 120 is adapted to transport substrates to any location within atmospheric section 105. For example, ATM robot 120 may transport substrates among substrate holding cassettes 115, aligner 145, load lock A 135, and load lock B 140. Drive section 150 receives commands from controller 170 and, in response, directs radial, circumferential and elevational motions of ATM robot 120.

Commonly assigned U.S. Pat. No. 5,102,280, incorporated by reference in its entirety, discloses an example of such a substrate transport apparatus.

In other embodiments, ATM robot 120 may be any other suitable type of transport apparatus, for example, a SCARA robot, an articulating arm robot, a frog leg type apparatus, or a bi-symmetric transport apparatus.

Substrate processing apparatus 100 also has an aligner 145, for placing a substrate in a known position in relationship to other components of substrate processing apparatus 100. By placing the substrate in a known position, the substrate may be manipulated and transported by ATM robot 120 and vacuum substrate transport apparatus 130 for delivery to a predetermined location within substrate processing apparatus 100 with a predetermined alignment. Aligner 145 may be located in atmospheric section 105, in vacuum section 110, or anywhere within substrate processing apparatus 100, and may be accessed by ATM robot 120 and/or vacuum substrate transport apparatus 130. In the embodiment shown in FIG. 1, aligner 145 is located in atmospheric section 105, and is accessible by ATM robot 120.

Figure 3:
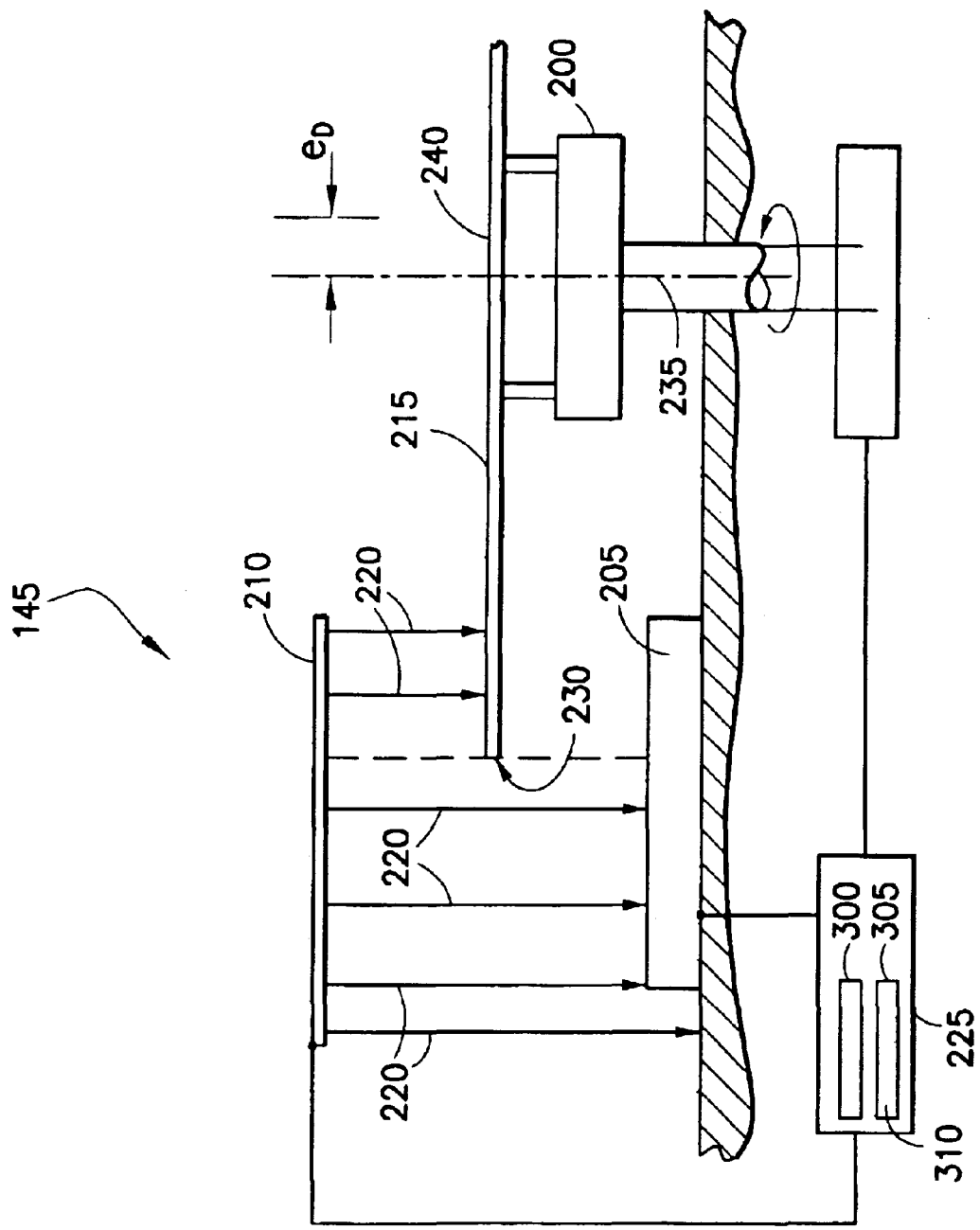
FIG. 3 is a schematic diagram of an example embodiment of an aligner incorporating the features of the present invention.

An example embodiment of aligner 145 is shown in FIG. 3. Aligner 145 includes a supporting chuck 200, a radiation sensor 205, a radiation source 210, and control circuitry 225. In this embodiment, radiation sensor 205 is a CCD array having a number of pixels, and radiation source produces radiation that is detected by the pixels of radiation sensor 205. Also as part of this embodiment, control circuitry 225 includes a processor 300 and memory 305. Processor 300 controls radiation source 210, radiation sensor 205, and supporting chuck 200 in accordance with parameters stored in memory 305. Memory 305 includes at least one parameter, referred to as a calibration factor 310. One example of calibration factor 310 is embodied as a number of pixels of radiation sensor 205 spanning a linear dimension, for example, 418 pixels per 2540 microns.

As part of an alignment procedure, a substrate 215 is placed on supporting chuck 200 by end effector 165 of ATM robot 120. In an ideal situation, if substrate 215 is in alignment, that is, in a known position in relationship to other components of substrate processing apparatus 100, a centroid 240 of substrate. 215 corresponds to an axis of rotation 235 of supporting chuck 200. Radiation source 210 directs radiation represented by arrows 220 towards radiation sensor 205 in a direction perpendicular to a plane of substrate 215. Radiation that is not obstructed by substrate 215 impinges on radiation sensor 205. Under direction of control circuitry 225, supporting chuck 200 is rotated about axis 235 and radiation sensor 225 senses features of a peripheral edge 230 of substrate 215 including the location of a fiducial 245. After sensing the features of peripheral edge 230, aligner 145 rotates the substrates fiducial to a user defined post position. Using the features of peripheral edge 230, control circuitry 225 determines the centroid 240 of substrate 215 and determines an amount of misalignment between centroid 240 and rotation axis 235.

In another embodiment, control circuitry 225 determines an amount of linear misalignment in terms of an eccentricity distance $e_D$ and an amount of angular misalignment in terms of an eccentricity angle $e_\theta$ (shown in FIG. 2). The eccentricity distance $e_D$ and eccentricity angle $e_\theta$ are conveyed to ATM robot 120 which then repositions substrate 215 on supporting chuck 200 so that it is in alignment. Alternatively, ATM robot 120 utilizes eccentricity distance $e_D$ and eccentricity angle $e_\theta$ as known offsets and compensates for these offsets when transporting substrate 215 to a desired location within substrate processing apparatus 100.

In addition to the above described alignment procedure, aligner 145 is also capable of performing a scan procedure. The scan procedure is essentially the same as the alignment procedure except that, after sensing the features of peripheral edge 230, aligner 145 simply stops and does not rotate the fiducial to a user defined post position.

An example of such an aligner is found in commonly assigned U.S. Pat. No. 6,195,619, which is incorporated by reference in its entirety.

Returning to FIG. 1, vacuum section 110 has a central chamber 175 which may be maintained substantially at a vacuum to prevent contamination of substrates while being transported among processing modules 126, load lock A 135, or load lock B 140.

It should be understood that central chamber 175 may contain any other desired atmosphere for processing one or more substrates 215. Vacuum section 110 may include appropriate systems and plumbing (not shown) for generating, and maintaining the desired atmosphere in central chamber 175. For example, a vacuum pump (not shown) may be mounted to vacuum section 110 and connected to central chamber 175 using suitable plumbing to draw a desired vacuum condition in central chamber 175. The vacuum pump may be regulated by controller 170 using appropriate monitoring devices (not shown) such as pressure gages.

Processing modules 125 are disposed generally around the periphery of central chamber 175 and communicate with central chamber 175 through openings 180. Load lock A 135 and load lock B 140 communicate with central chamber 175 through openings 185. Openings 180, 185 comprise slot valves, solenoid valves, hydraulic valves, or any other suitable valves that are capable of being individually opened and closed, and that when closed, form a substantially airtight seal between the central chamber and the corresponding processing module or load lock. Openings 180, 185 are cycled between the open and closed position by controller 170, and send a suitable signal to controller 170 to indicate their position.

Each processing module 125 may include one or more systems for processing substrates, for example, sputtering, coating, etching, soaking, or any other suitable process for substrates deposited in the respective processing modules. Each processing module 125 may also include additional openings (not shown) that allow communication with other equipment, or substrate processing by other equipment.

Vacuum substrate transport apparatus 130 is mounted in central chamber 175. Vacuum substrate transport apparatus 130 is also referred to as VAC robot 130. Controller 170 cycles openings 180, 185 and coordinates the operation of VAC robot 130 for transporting substrates among processing modules 125, load lock A 135, and load lock B 140.

Figure 4:
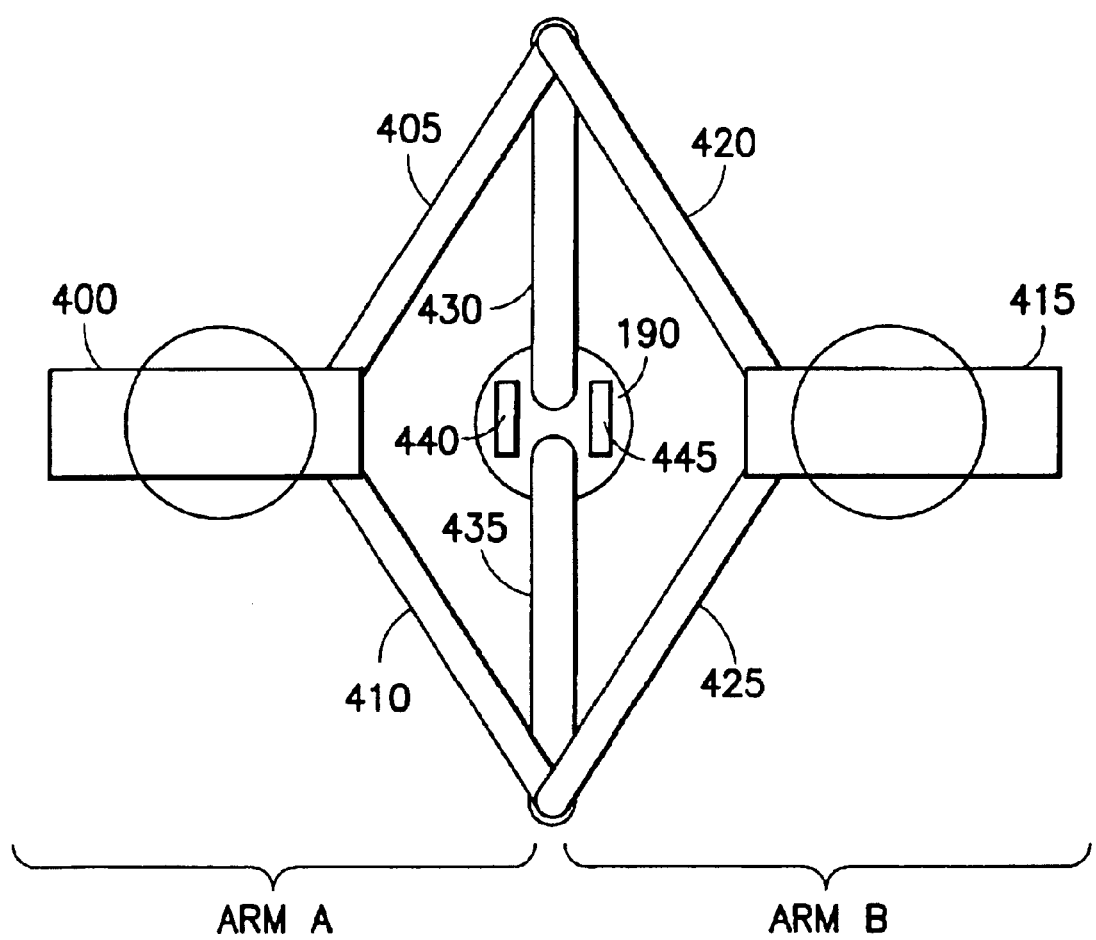
FIG. 4 is a diagram of an example embodiment of a vacuum substrate transport apparatus incorporating the features of the present invention.

VAC robot 130 includes a drive section 190 and one or more end effectors 195. One embodiment of VAC robot 130 is described in U.S. Pat. No. 5,180,276, incorporated by reference in its entirety, and shown in FIG. 4. In this embodiment, VAC robot 130 has a primary end effector 400 coupled to primary forearms 405, 410. VAC robot 130 also has a secondary end effector 415 coupled to secondary forearms 420, 425. Primary forearm 405 and secondary forearm 420 are coupled to a first rotating arm 430. Primary forearm 410 and secondary forearm 425 are coupled to a second rotating arm 435. First rotating arm 430 and second rotating arm 435 are coupled to drive section 190. Primary end effector 400 and primary forearms 405, 410 are collectively referred to as arm A, while secondary end effector 415 and secondary forearms 420, 425 are collectively referred to a arm B. Drive section 190 is capable of causing first rotating arm 430 and second rotating arm 435 to rotate toward primary end effector 400, thus causing arm A to extend an alarm B to retract. Drive section 190 is also capable of causing first rotating arm 430 and second rotating arm 435 to rotate toward secondary end effector 415, thus causing arm B to extend and arm A to retract. Drive section 190 has a processor 440 and a memory 445 for storing the locations of processing modules 125, load lock A 135, and load lock B 140.

Returning to FIG. 1, drive section 190 is rotatably mounted on vacuum section 110, and thus is capable of using arm A or arm B to place substrates in any of processing modules 125, in load lock A 135, or in load lock B.

In accordance with the present invention, a technique will now be described for correcting for errors and changes in component locations, and to provide for more exact positioning of substrates in substrate processing apparatus 100. The technique includes adjusting aligner calibration factor 310 to synchronize the aligner's eccentricity distance measurement to the radial motion of ATM robot 120. Then, the coordinate systems of aligner 145 and VAC robot 130 are synchronized using ATM robot 120. The VAC robot coordinates of load lock A 135 and load lock B 140 are also synchronized.

Thus, various coordinate systems used in substrate processing apparatus 100 are synchronized, that is, calibrated to each other so that upon measuring a distance or determining location coordinates, each system obtains substantially the same result. When the various coordinate systems are synchronized, the coordinates of processing modules 125, used by VAC robot 130 are corrected, that is, the previously stored coordinates are updated in accordance with the synchronized coordinate system of VAC robot 130.

The technique to provide for more exact positioning of substrates may be performed under the direction of controller 170.

Figure 5:
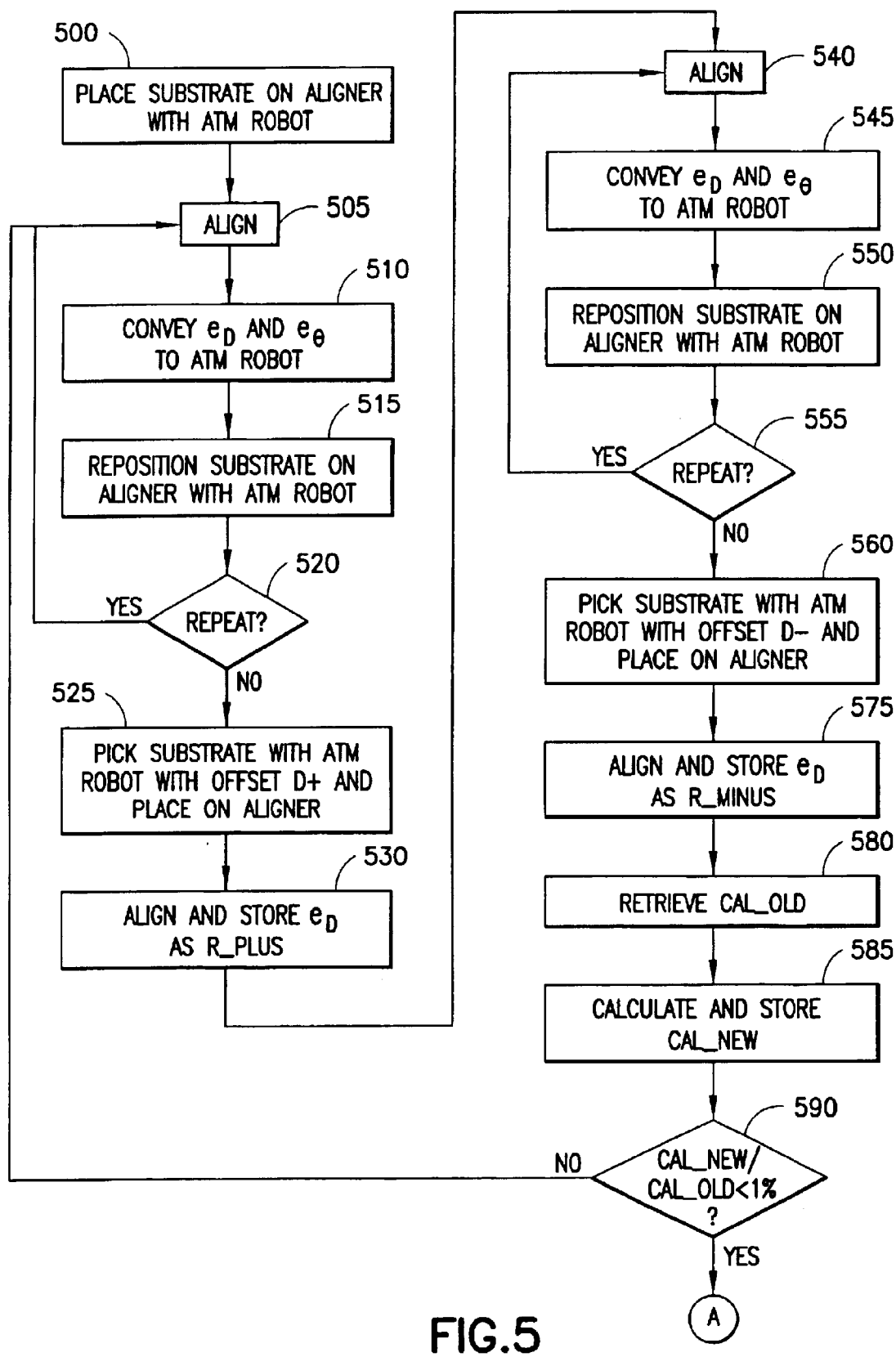
FIG. 5 is a flow diagram for adjusting the calibration factor for the aligner.

Referring to FIG. 5, the aligner calibration factor adjustment procedure commences when, under the direction of controller 170 (see also FIG. 1), ATM robot 120 places substrate 215 on supporting chuck 200 of aligner 145 in step 500. Aligner 145 performs an alignment procedure in step 505 as described above and eccentricity distance $e_D$ and eccentricity angle $e_\theta$ are conveyed to ATM robot 120 in step 510. ATM robot 120 repositions substrate 215 on supporting chuck 200 so that it is in alignment in step 515. This alignment and repositioning may be repeated a number of times if desired as shown in step 520.

ATM robot 120 then picks substrate. 215 with a positive radial offset D+ and returns substrate 215 to aligner 145 in step 525. In step 530 aligner 145 performs an alignment procedure and controller 170 stores eccentricity distance $e_D$ as R_plus in memory 178. Aligner 145 again performs an alignment procedure in step 540 and eccentricity distance $e_D$ and eccentricity angle $e_\theta$ are conveyed to ATM robot 120 in step 545. In step 550 ATM robot 120 repositions substrate 215 on supporting chuck 200 so that it is in alignment. This alignment and repositioning may be repeated a number of times if desired as shown in step 555.

ATM robot 120 then picks substrate 215 with a negative radial offset D− and returns substrate 215 to aligner 145 in step 560. In this embodiment D+ is equal to about +2540 microns and D− is equal to about −2540 microns. In alternate embodiments, any suitable offset may be used. Aligner 145 performs an alignment procedure and controller 170 stores eccentricity distance $e_D$ as R_minus in memory 178 in step 575. Controller 178 retrieves aligner calibation factor 310 (see FIG. 3) from memory 305 and stores it in memory 178 as CAL_OLD in step 580. In step 585 controller 178 calculates a new calibration factor, CAL_NEW using the following equations:

$$CAL\_NEW = CAL\_OLD/SLOPE$$

where $$SLOPE = (R\_plus + R\_minus)/2000$$

The value of CAL_NEW is stored as aligner calibration factor 310 in memory 305. The aligner calibration factor adjustment procedure is repeated until CAL_NEW/CAL_OLD is less than a certain threshold, in this embodiment approximately 1%, as shown in step 590.

Figure 6:
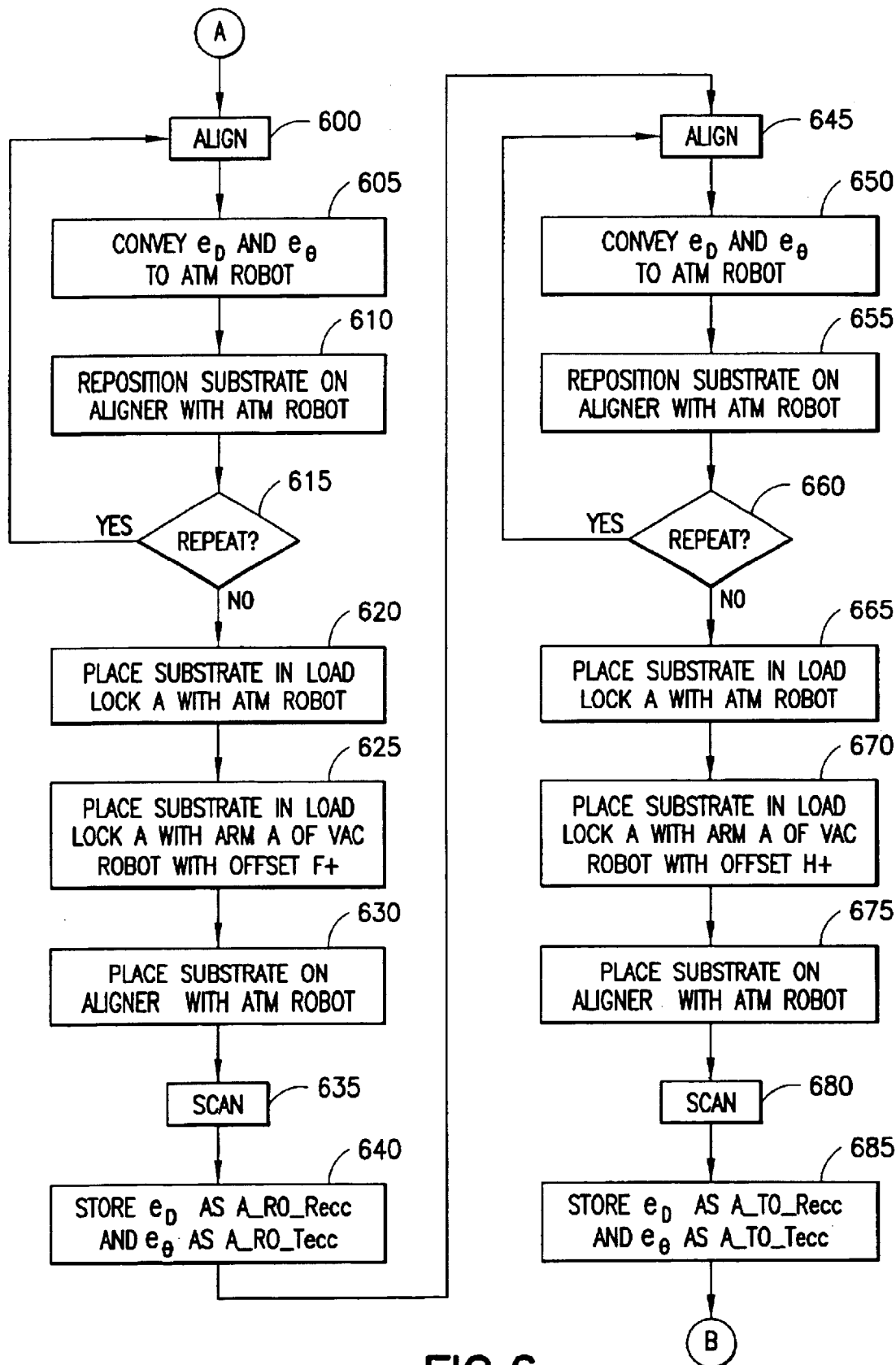
FIG. 6 is a flow diagram for synchronizing the coordinate system of the aligner with the coordinate system of arm A of the second substrate transport apparatus.

Turning now to FIG. 6, the technique to provide for more exact positioning of substrates continues with the synchronization of the coordinate systems of aligner 145 and VAC robot 130. In step 600, aligner 145 performs an alignment procedure on substrate 215, and in step 605, eccentricity distance $e_D$ and eccentricity angle $e_\theta$ are conveyed to ATM robot 120. ATM robot 120 repositions substrate 215 on supporting chuck 200 so that it is in alignment in step 610. This alignment and repositioning may be repeated a number of times if desired as shown in step 615. ATM robot 120 then places substrate 215 in load lock A 135 in step 620. As shown in step 625, arm A of VAC robot 130 picks substrate 215 and places it in load lock A 135 with a positive radial offset F+. In this embodiment, F+ is equal to 100 mils, however, any suitable offset may be used. In step 630 ATM robot 120 picks substrate 215 from load lock A and places it on supporting chuck 200. Aligner 145 performs a scan procedure as shown in step 635. In step 643 controller 170 requests the scan results from aligner 145, stores eccentricity distance $e_D$ as A_RO_Recc, and stores eccentricity angle $e_\theta$ as A_RO_Tecc in memory 178.

Aligner 145 performs an alignment procedure on substrate 215 in step 645 and eccentricity distance $e_D$ and eccentricity angle $e_\theta$ are conveyed to ATM robot 120 in step 650. ATM robot 120 repositions substrate 215 on supporting chuck 200 so that it is in alignment in step 655. As shown in step 660, this alignment and repositioning may be repeated a number of times if desired.

In step 665, ATM robot 120 then places substrate 215 back in load lock A 135. In step 670, arm A of VAC robot 130 picks substrate 215 and places it in load lock A 135 with a positive tangential offset H+. In this embodiment, H is equal to 0.2 degrees, although any suitable offset may be used. Atmospheric substrate transport apparatus 215 picks substrate 215 from load lock A and places it on supporting chuck 200 in step 675. In step 680, aligner 145 performs a scan procedure. Controller 170 requests the scan results from aligner 145 and stores eccentricity distance $e_D$ as A_TO_Recc and stores eccentricity angle $e_\theta$ as A_TO_Tecc in memory 178 as shown in step 685. A_RO_Recc, A_RO_Tecc, A_TO_Recc, and A_TO_Tecc are used to adjust the coordinate system of VAC robot 130 as will be described below.

Figure 7:
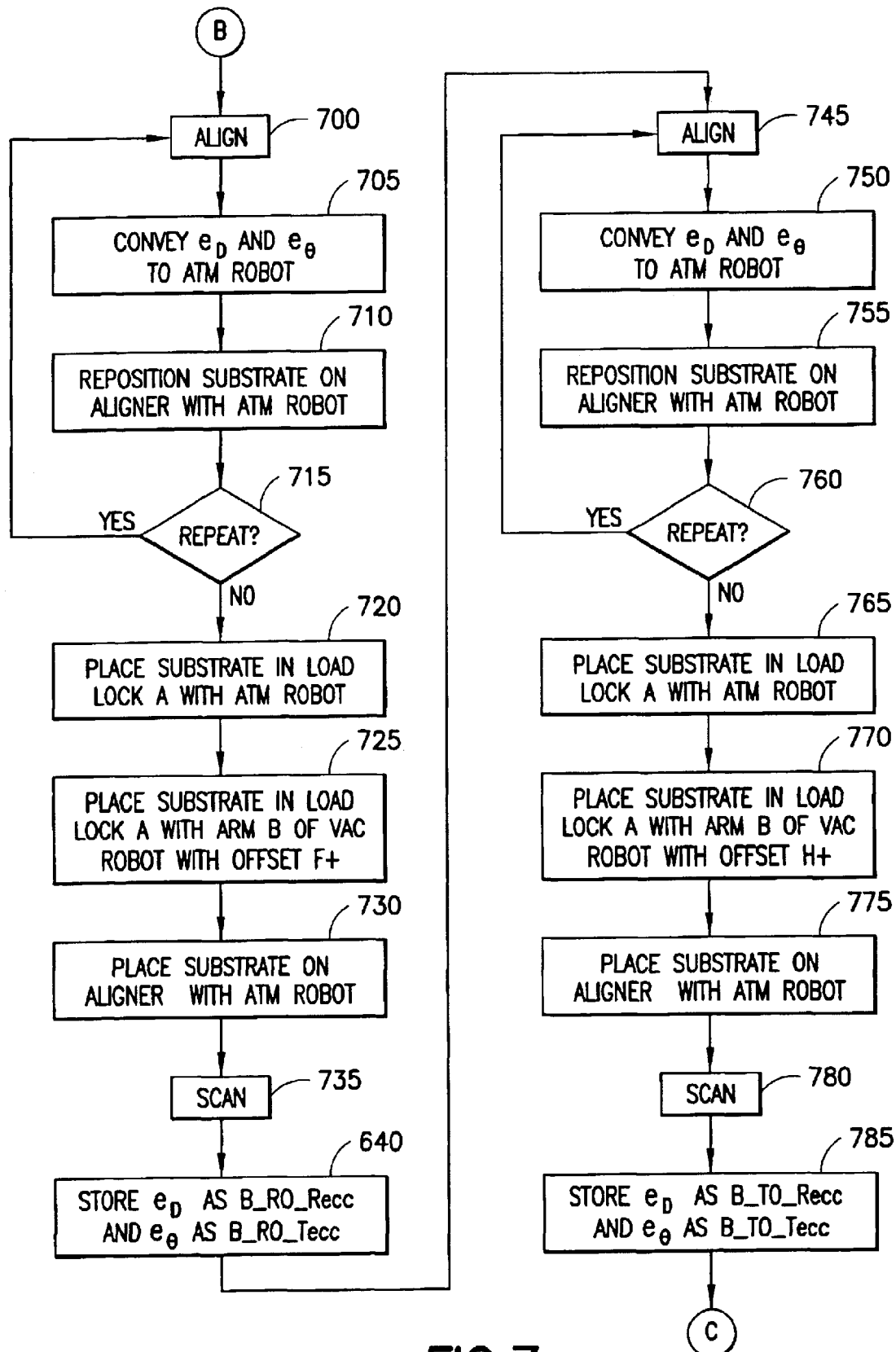
FIG. 7 is a flow diagram for synchronizing the coordinate system of the aligner with the coordinate system of arm B of the second substrate transport apparatus.

Referring to FIG. 7, it can be seen that a substantially similar synchronization of the coordinate systems of aligner. 145 and VAC robot 130 is performed using arm B of VAC robot 130. For example, in step 740, controller 170 stores the resulting eccentricity distance $e_D$ and eccentricity angle $e_\theta$ for the radial offset as B_RO_Recc and B_RO_Tecc, respectively, in memory 178.

Step 785 shows that controller 170 stores the resulting eccentricity distance $e_D$ and eccentricity angle $e_\theta$ for the tangential offset as B_TO_Recc and B_TO_Tecc, respectively, also in memory 178.

Figure 8:
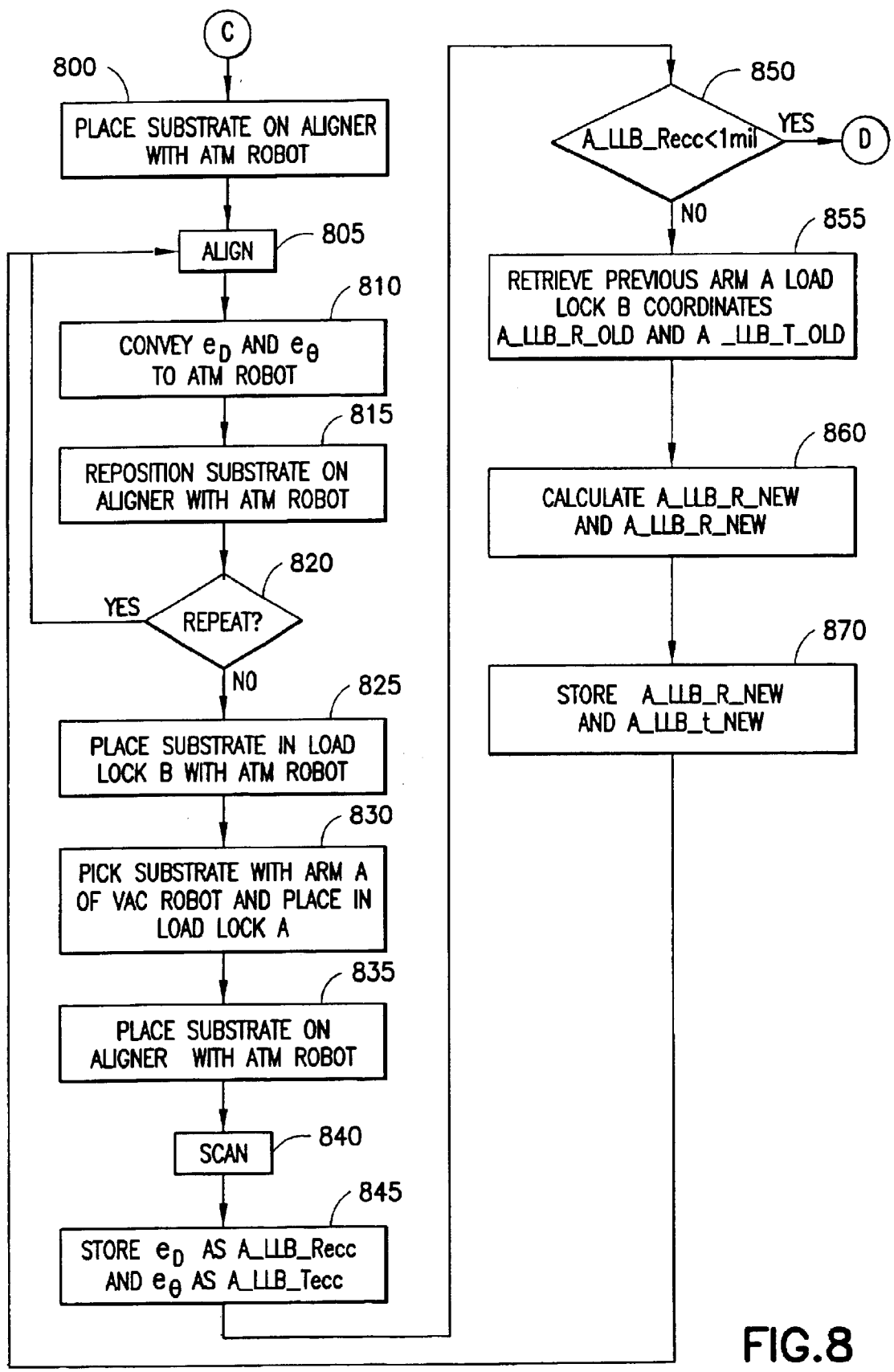
FIG. 8 is a flow diagram for synchronizing coordinates for load locks in the system, stored for arm A of the second substrate transport apparatus.

The technique to provide for more exact positioning of substrates continues with the synchronization of the VAC robot coordinates of load lock A 135 and load lock B 140. Turning now to FIG. 8, ATM robot 120 again places substrate 215 on supporting chuck 200 in step 800. Aligner 145 performs an alignment procedure on substrate 215 as shown in step 805. In step 810, eccentricity distance $e_D$ and eccentricity angle $e_\theta$ are conveyed to ATM robot 120 which, in step 815, repositions substrate 215 on supporting chuck 200 so that it is in alignment. As shown in step 820, this alignment and repositioning may be repeated a number of times if desired. In step 825, ATM robot 120 then places substrate 215 in load lock B 140.

To synchronize the coordinates of load lock A 135 and load lock B 140 for arm A, controller 170 begins by causing VAC robot 130, in step 830, to pick substrate 215 with arm A and place it in load lock A. In step 835, ATM robot 120 picks substrate 215 from load lock A 135 and places it on supporting chuck 200. Aligner 145 performs a scan procedure in step 840. In step 845, controller 170 requests the scan results from aligner 145 and stores eccentricity distance $e_D$ as A_LLB_Recc and stores eccentricity angle $e_\theta$ as A_LLB_Tecc in memory 178.

As shown in step 850, if eccentricity distance $e_D$ (A_LLB_Recc) is less than a particular threshold, in this embodiment approximately 1 mil, the coordinates of load lock A and B are considered synchronized for arm A and the correction technique proceeds to synchronize the coordinates for arm B.

If eccentricity distance $e_D$ (A_LLB_Recc) is equal to or more than a particular threshold, in this embodiment approximately 1 mil, controller 170 retrieves previously stored arm A coordinates for load lock B, A_LLB_R_OLD and A_LLB_T_OLD, from memory 445 as shown in step 855. In step 860, controller 170 then calculates new coordinates for load lock B when accessed by arm A, A_LLB_R_NEW and A_LLB_T_NEW, using the following equations:

$$A\_LLB\_R\_NEW = A\_LLB\_R\_OLD + (2540/A\_RO\_Recc) * \Delta R\_A\_LLB$$

where $$\Delta R\_A\_LLB = A\_LLB\_Recc * \cos[(A\_LLB\_Tecc - A\_RO\_Tecc) * 3.14/1800]$$

and $$A\_LLB\_T\_NEW = A\_LLB\_T\_OLD + (200/A\_TO\_Recc) * \Delta T\_A\_LLB$$

where $$\Delta T\_A\_LLB = A\_LLB\_Recc * \sin[(A\_LLB\_Tecc - A\_RO\_Tecc) * 3.14/1800]$$

In step 870, controller 170 then stores A_LLB_R_NEW and A_LLB_T_NEW as coordinates for load lock B 140 for arm A in memory 445. Controller 170 repeats the synchronization of the coordinates of load lock A 135 and load lock B 140 for arm A until the eccentricity distance $e_D$ (A_LLB_Recc) returned from aligner 145 is less than approximately 1 mil.

Figure 9:
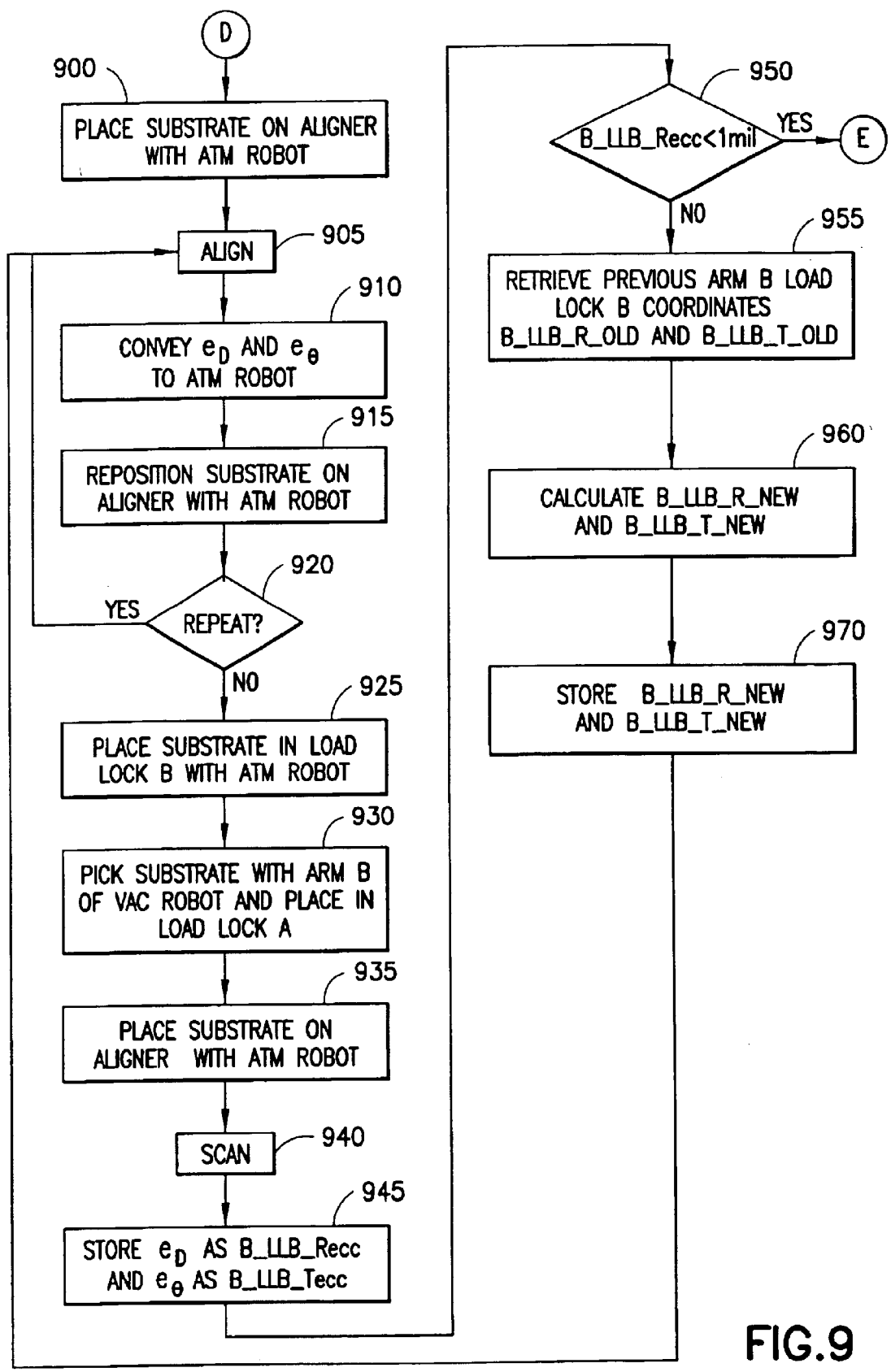
FIG. 9 is a flow diagram for synchronizing coordinates for load locks in the system, stored for arm B of the second substrate transport apparatus.

Referring now to FIG. 9, controller 170 synchronizes the coordinates of load lock A 135 and load lock B 140 for arm B using a similar procedure. In step 900, ATM robot 120 places substrate 215 on supporting chuck 200. In step 905, aligner 145 performs an alignment procedure on substrate 215. The resulting eccentricity distance $e_D$ and eccentricity angle $e_\theta$ are conveyed to ATM robot 120 in step 910 which repositions substrate 215 on supporting chuck 200 in an alignment position as shown in step 915. As shown in step 920, this alignment and repositioning may be repeated a number of times if desired. ATM robot 120 then places substrate 215 in load lock B 140 in step 925. Controller 170 then causes VAC robot 130 to pick substrate 215 with arm B and place it in load lock A in step 930. ATM robot 120 picks substrate 215 from load lock A 135 and places it on supporting chuck 200 in step 935. As shown in step 940, aligner 145 performs a scan procedure. In step 945, controller 170 requests the scan results from aligner 145 and stores eccentricity distance $e_D$ as B_LLB_Recc and stores eccentricity angle $e_\theta$ as B_LLB_Tecc in memory 178.

As shown in step 950, if eccentricity distance $e_D$ (B_LLB_Recc) is less than a particular threshold, for example approximately 1 mil, the coordinates of load lock A and B are considered synchronized for arm B and the correction technique proceeds to correct the coordinates of processing modules 125.

If eccentricity distance $e_D$ (B_LLB_Recc) is equal to or more than a certain threshold, for example approximately 1 mil, step 955 shows that controller 170 retrieves previously stored arm B coordinates for load lock B, B_LLB_R_OLD and B_LLB_T_OLD, from memory 445. In step 960, controller 170 then calculates new coordinates for load lock B when accessed by arm B, B_LLB_R_NEW and B_LLB_T_NEW, using the following equations:

$$B\_LLB\_R\_NEW = B\_LLB\_R\_OLD + (2540/B\_RO\_Recc) * \Delta R\_B\_LLB$$

where $$\Delta R\_B\_LLB = B\_LLB\_Recc * \cos[(B\_LLB\_Tecc - B\_RO\_Tecc) * 3.14/1800]$$

and $$B\_LLB\_T\_NEW = B\_LLB\_T\_OLD + (200/B\_TO\_Recc) * \Delta T\_B\_LLB$$

where $$\Delta T\_B\_LLB = B\_LLB\_Recc * \sin[(B\_LLB\_Tecc - B\_RO\_Tecc) * 3.14/1800]$$

In step 970, controller 170 then stores B_LLB_R_NEW and B_LLB_T_NEW as coordinates for load lock B 140 for arm B in memory 445. Controller 170 repeats the synchronization of the arm B coordinates of load lock A 135 and load lock B until the returned eccentricity distance $e_D$ or B_LLB_Recc is less than approximately 1 mil.

Figure 10:
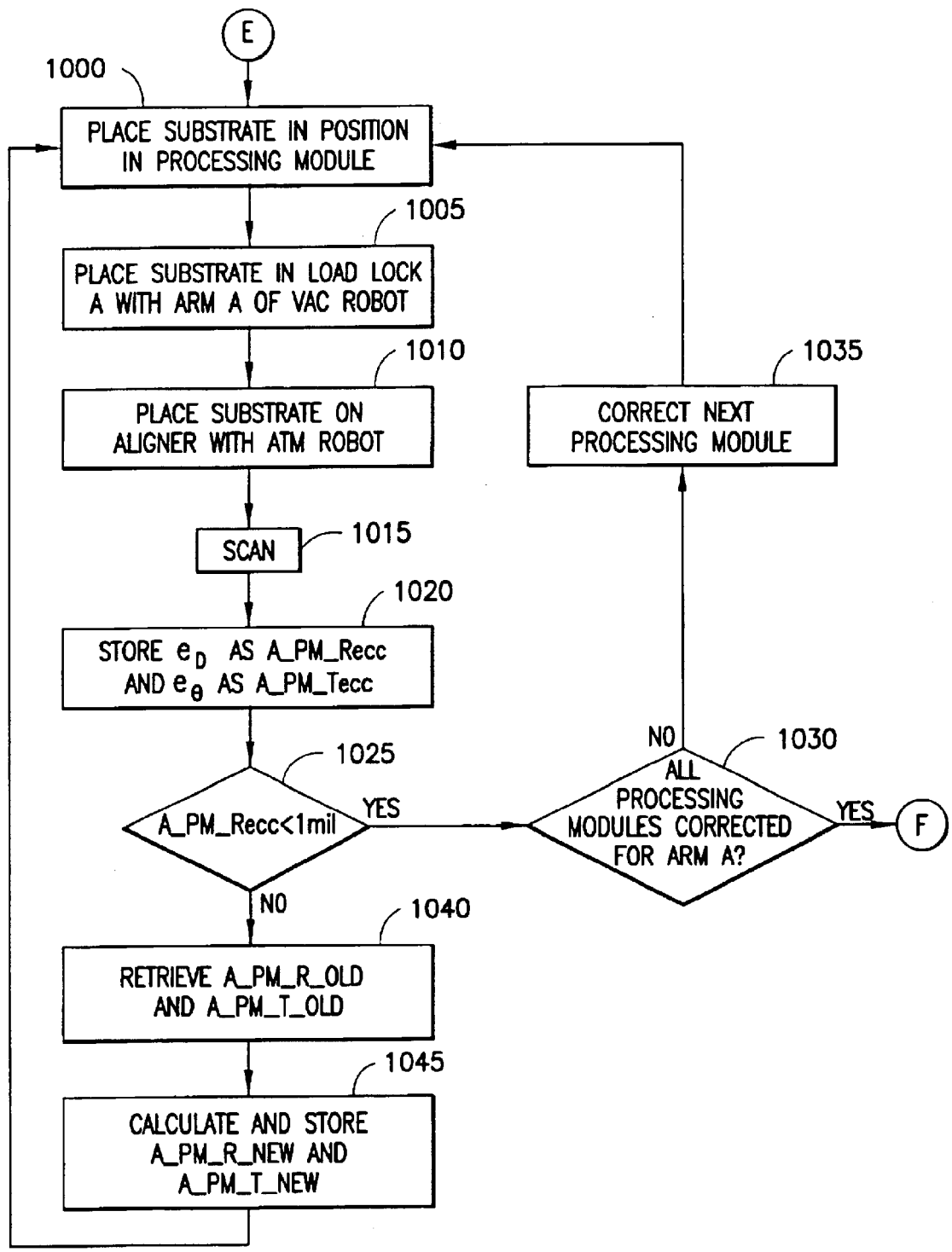
FIG. 10 is a flow diagram for correcting coordinates for processing modules in the system, stored for arm A of the second substrate transport apparatus.

Turning now to FIG. 10, the technique to provide for more exact positioning of substrates then proceeds to correct the VAC robot coordinates of processing modules 125. The embodiment of substrate processing apparatus 100, shown in FIG. 1, has six processing modules 125, designated as PM1, PM2, . . . PM6. The coordinates for each processing module PM1, PM2, . . . PM6, are corrected for each arm, A and B, of VAC robot 130. In step 1000, correction of arm A coordinates begins by placing substrate 215 in the desired position of processing module PM1. In step 1005, controller 170 then causes arm A of VAC robot 130 to pick substrate 215 from processing module PM1 and place it in load lock A 135. In step 1010, ATM robot 120 picks substrate 215 and places it on supporting chuck 200, and in step 1015, aligner 145 performs a scan procedure. Controller 170 then requests the scan results and stores eccentricity distance $e_D$ as A_PM1_Recc and eccentricity angle $e_\theta$ as A_PM1_Tecc in memory 178 as shown in step 1020.

If eccentricity distance $e_D$ (A_PM1_Recc) is less than a certain threshold, in this example approximately 1 mil, the coordinates for that particular processing module are considered correct and the correction technique proceeds to the next module as shown in step 1025.

Step 1040 shows that if eccentricity distance $e_D$ (A_PM1_Recc) is equal to or greater than a certain value, for example approximately 1 mil, controller 170 retrieves the present arm A coordinates of processing module PM1 from memory 445 of VAC robot 130. The coordinates are stored as A_PM1_R_OLD and A_PM1_T_OLD. In step 1045, controller 170 calculates new arm A coordinates A_PM1_R_NEW and A_PM1_T_NEW for processing module PM1 using the following equations:

$$A\_PM1\_R\_NEW = A\_PM1\_R\_OLD + (2540/A\_RO\_Recc) * \Delta R\_A\_PM1$$

where $$\Delta R\_A\_PM1 = A\_PM1\_Recc * \cos[(A\_PM1\_Tecc - A\_RO\_Tecc) * 3.14/1800]$$

and $$A\_PM1\_T\_NEW = A\_PM1\_T\_OLD + (200/A\_TO\_Recc) * \Delta T\_A\_PM1$$

where $$\Delta T\_A\_PM1 = A\_PM1\_Recc * \sin[(A\_PM1\_Tecc - A\_RO\_Tecc) * 3.14/1800]$$

Controller 170 stores the new arm A coordinates for processing module PM1, A_PM1_R_NEW and A_PM1_T_NEW, in memory 445 of VAC robot 130.

The correction of arm A VAC robot coordinates of processing module PM1 is repeated until the eccentricity distance $e_D$ (A_PM1_Recc) returned from aligner 145 is less than approximately 1 mil.

The correction procedure for arm A coordinates is then repeated for each processing module PM2, PM3, . . . PM6 as shown in steps 1030 and 1035.

Figure 11:
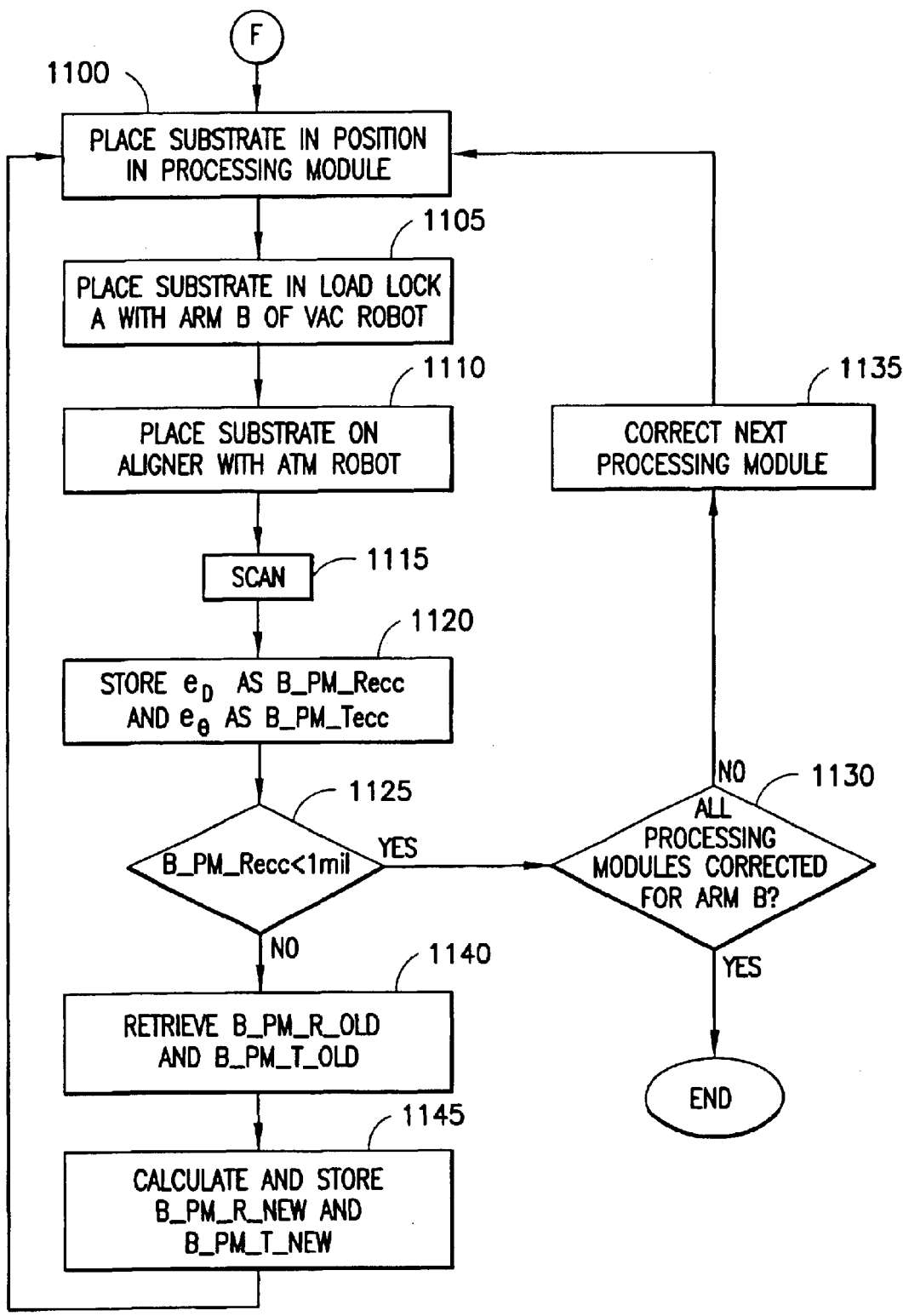
FIG. 11 is a flow diagram for correcting coordinates for processing modules in the system, stored for arm B of the second substrate transport apparatus.

FIG. 11 shows that correction of arm B coordinates proceeds in a similar manner. In step 1100, substrate 215 is placed by hand in the desired position of PM1.

Alternatively, ATM robot 120 places substrate 215 on supporting chuck 200. Aligner 145 performs an alignment procedure on substrate 215. The resulting eccentricity distance $e_D$ and eccentricity angle $e_\theta$ are conveyed to ATM robot 120 which repositions substrate 215 on supporting chuck 200 in an alignment position. This alignment and repositioning may be repeated a number of times if desired. ATM robot 120 then places substrate 215 in load lock A 135. In accordance with step 1100, controller 170 then causes VAC robot 130 to pick substrate 215 with arm A and place it in processing module PM1.

Once substrate 215 has been accurately placed in processing module PM1, controller 170 causes arm B to pick substrate 215 from processing module PM1 and place it in load lock A 135 as shown in step 1105. In step 1110, ATM robot 120 picks substrate 215 and places it on supporting chuck 200 where, in step 1115, aligner 145 performs a scan procedure. Controller 170 then requests the scan results and stores eccentricity distance $e_D$ as B_PM1_Recc and eccentricity angle $e_\theta$ as B_PM1_Tecc in memory 178 as shown in step 1120.

As shown in step 1125, if eccentricity distance $e_D$ (B_PM1_Recc) is less than a particular value, in this embodiment approximately 1 mil, the coordinates for that particular processing module are considered correct and the correction technique proceeds to the next module.

If eccentricity distance $e_D$ (B_PM1_Recc) is equal to or greater than a particular value, in this example approximately 1 mil, controller 170 retrieves arm B's present coordinates for processing module PM1 from memory 445 and stores them as B_PM1_R_OLD and B_PM1_T_OLD as shown in step 1140. In step 1145, controller 170 calculates new coordinates of processing module PM1 for arm B, B_PM1_R_NEW and B_PM1_T_NEW using the following equations:

$$B\_PM1\_R\_NEW = B\_PM1\_R\_OLD + (2540/B\_RO\_Recc)*\Delta R\_B\_PM1$$

where $$\Delta R\_B\_PM1 = B\_PM1\_Recc*\cos[(B\_PM1\_Tecc - B\_RO\_Tecc)*3.14/1800]$$

and $$B\_PM1\_T\_NEW = B\_PM1\_T\_OLD + (200/B\_TO\_Recc)*\Delta T\_B\_PM1$$

where $$\Delta T\_B\_PM1 = B\_PM1\_Recc*\sin[(B\_PM1\_Tecc - B\_RO\_Tecc)*3.14/1800]$$

Controller 170 stores the new coordinates of processing module PM1 for arm B, B_PM1_R_NEW and B_PM1_T_NEW, in memory 445 of VAC robot 130.

The correction of coordinates of processing module PM1 for arm B is repeated until the eccentricity distance $e_D$ (B_PM1_Recc) returned from aligner 145 is less than approximately 1 mil.

Steps 1130 and 1135 show that the correction of processing module coordinates for arm B is repeated for each processing module PM2, PM3, . . . PM6.

Completion of the technique to provide for more exact positioning of substrates results in ATM robot 120, aligner 145, and VAC robot 130 operating together to position substrates more precisely in substrate processing apparatus 100. This is because aligner correction factor 310 and the radial motion of ATM robot 120 are more closely synchronized, as are the coordinate systems of aligner 145 and VAC robot 130. The technique also results in a close synchronization of the coordinates of load lock A 135 and load lock B. After the various alignment systems and coordinates are synchronized, the coordinates for processing modules PM1, PM2, . . . PM6, used by VAC robot 130 are corrected to a high degree of accuracy.

Controller 170 is disclosed in the context of a stand alone device with processor 173 and memory 178. It should be understood that controller 170 may be implemented in any combination of hardware and software suitable for providing control functions for substrate processing system 100. It should also be understood that controller 170 may be a self contained device or may be a distributed device, for example, a combination of processes and circuitry connected by a network.

While VAC robot 130 is described in the context of having dual arms, A and B, processor 440 and memory 445, it should be understood that VAC robot 130 may be of any configuration suitable for transporting substrates within substrate processing apparatus 100.

Aligner 145 is disclosed as including supporting chuck 200, radiation source 210, and radiation detector 205, all controlled by control circuitry 225. However, aligner 145 may be any mechanism capable of detecting and conveying misalignment information to ATM robot 120 or VAC robot 130.

Substrate processing apparatus 100 is shown as having six processing modules 126 (PM1 . . . PM6) positioned around the periphery of central chamber 175. However, it should be understood that substrate processing apparatus 100 may have any number of processing modules 126 and they may be in any location accessible by at least one of ATM robot 120 or VAC robot 130.

Thus, the present invention results in a substrate processing system that provides for more exact positioning of substrates. The present invention provides for more exact positioning by adjusting an aligner calibration factor to synchronize aligner calibration with a radial motion of a first substrate transport apparatus, and also provides for synchronizing a coordinate system of the aligner with a coordinate system of a second substrate transport apparatus. In addition, the second substrate transport apparatus' coordinates are synchronized to load locks in the system, and to correct processing module coordinates.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method for positioning substrates in a substrate processing apparatus having a substrate alignment device, a first substrate transport apparatus and a second substrate transport apparatus, the method comprising:
   calibrating the substrate alignment device with a motion of the first substrate transport apparatus; and
   calibrating a coordinate system of the second substrate transport apparatus with the substrate alignment device.

2. The method of claim 1, wherein calibrating the substrate alignment device with a motion of the first substrate transport apparatus comprises:
   picking a substrate with a first offset;
   recording a first misalignment of the substrate;
   picking the substrate with a second offset;
   recording a second misalignment of the substrate; and
   calculating a first calibration factor for the substrate alignment device from the first and second misalignments.

3. The method of claim 2, wherein the first and second offsets are radial offsets.

4. The method of claim 2, further comprising:
   retrieving a previously stored calibration factor for the substrate alignment device from a memory location;
   storing the first calibration factor in the memory location; and
   repeating the method of claim 2 if the ratio of the first calibration factor and the previously stored calibration factor is not less than a certain threshold.

5. The method of claim 4, further comprising utilizing the first calibration factor for calculating misalignment of the substrate.

6. The method of claim 4, wherein the certain threshold is approximately 1%.

7. The method of claim 1, wherein synchronizing the coordinate system of the substrate alignment device and the coordinate system of the second substrate transport apparatus comprises:
   placing a substrate with a third offset utilizing the second substrate transport apparatus;
   recording a third misalignment of the substrate;
   placing the substrate with a fourth offset utilizing the second substrate transport apparatus;
   recording a fourth misalignment of the substrate;
   utilizing the third and fourth misalignments to adjust the coordinate system of the second substrate transport apparatus.

8. The method of claim 7, wherein the third offset comprises a radial offset.

9. The method of claim 7, wherein the fourth offset comprises a tangential offset.

10. The method of claim 7, wherein the third and fourth misalignments each comprise a linear misalignment and an angular misalignment.

11. The method of claim 1, wherein the substrate processing apparatus has at least two load locks, the method further comprising synchronizing location coordinates of the at least two load locks.

12. The method of claim 11, wherein synchronizing location coordinates of the at least two load locks comprises:

placing a substrate in a first of the at least two load locks;

moving the substrate to a second of the at least two load locks;

recording a fifth misalignment of the substrate in the second load lock; and calculating new location coordinates for the second load lock.

13. The method of claim 12, wherein calculating new location coordinates for the second load lock comprises:

retrieving previously stored location coordinates for the second load lock from a memory location if the fifth misalignment is more than or equal to a particular threshold;

calculating new location coordinates for the second load lock utilizing the fifth misalignment;

storing the new location coordinates in the memory location; and repeating the method of claim 12.

14. The method of claim 13, wherein the particular threshold is approximately 1 mil.

15. The method of claim 1, wherein the substrate processing apparatus has at least one processing module, the method further comprising correcting location coordinates of the at least one processing module.

16. The method of claim 15, wherein correcting location coordinates of the at least one processing module comprises:

placing a substrate at a known location in the at least one processing module;

picking the substrate with the second substrate transport apparatus and conveying the substrate to the substrate alignment apparatus;

recording a sixth misalignment of the substrate; and calculating new location coordinates for the at least one processing module.

17. The method of claim 16, wherein calculating new location coordinates for the at least one processing module comprises:

retrieving previously stored location coordinates for the at least one processing module from a memory location if the sixth misalignment is more than or equal to a particular threshold;

calculating new location coordinates for the at least one processing module utilizing the sixth misalignment;

storing the new location coordinates in the memory location; and repeating the method of claim 16.

18. The method of claim 17, wherein the particular threshold is approximately 1 mil.

19. The method of claim 1, wherein the substrates being positioned are 200 mm or 300 mm semiconductor wafers.

20. A computer program product comprising:

a computer useable medium having computer readable code embodied therein for causing a computer to position substrates in a substrate processing apparatus, the computer readable code comprising:

computer readable program code for causing a computer to calibrate a substrate alignment device with a motion of a first substrate transport apparatus; and computer readable program code for causing a computer to calibrate a coordinate system of a second substrate transport apparatus with the substrate alignment device.

21. The computer program product of claim 20, wherein the computer readable code for causing a computer to calibrate the substrate alignment device with a motion of the first substrate transport apparatus further comprises:

computer readable program code for causing a computer to pick a substrate with a first offset;

computer readable program code for causing a computer to record a first misalignment of the substrate;

computer readable program code for causing a computer to pick the substrate with a second offset;

computer readable program code for causing a computer to record a second misalignment of the substrate; and computer readable program code for causing a computer to calculate a first calibration factor for the substrate alignment device from the first and second linear misalignments.

22. The computer program product of claim 21, further comprising:

computer readable program code for causing a computer to retrieve a previously stored calibration factor for the substrate alignment device from a memory location;

computer readable program code for causing a computer to store the first calibration factor in the memory location; and computer readable program code for causing a computer to repeat the method of claim 20 if the ratio of the first calibration factor and the previously stored calibration factor is not less than a certain threshold.

23. The computer program product of claim 22, further comprising computer readable program code for causing a computer to utilize the first calibration factor for calculating misalignment of the substrate.

24. The computer program product of claim 20 wherein the computer readable program code for causing a computer to synchronize the coordinate system of the substrate alignment device and the coordinate system of the second substrate transport apparatus comprises:

computer readable program code for causing a computer to place a substrate with a third offset utilizing the second substrate transport apparatus;

computer readable program code for causing a computer to record a third misalignment of the substrate;

computer readable program code for causing a computer to place the substrate with a fourth offset utilizing the second transport apparatus;

computer readable program code for causing a computer to record a fourth misalignment of the substrate; and computer readable program code for causing a computer to utilize the third and fourth misalignments to adjust the coordinate system of the second substrate transport apparatus.

25. The computer program product of claim 20, further comprising computer readable program code for causing a computer to synchronize location coordinates of at least one load lock of the substrate processing apparatus with the coordinate system of the second substrate transport apparatus.

26. The computer program product of claim 25, wherein the computer readable program code for causing a computer to synchronize location coordinates of the at least one load lock comprises:

computer readable program code for causing a computer to place a substrate in the at least one load lock;

computer readable program code for causing a computer to record a fifth misalignment of the substrate in the at least one load lock; and computer readable program code for causing a computer to calculate new location coordinates for the at least one load lock.

27. The computer program product of claim 26, wherein the computer readable program code for calculating new location coordinates for the at least one load lock comprises:

computer readable program code for causing a computer to retrieve previously stored location coordinates for the at least one load lock from a memory location if the fifth misalignment is more than or equal to a particular threshold;

computer readable program code for causing a computer to calculate new location coordinates for the at least one load lock;

computer readable program code for causing a computer to store the new location coordinates in the memory location; and computer readable program code for causing a computer to repeat the elements of claim 26.

28. The computer program product of claim 20, further comprising computer readable program code for causing a computer to correct location coordinates of at least one processing module of the substrate processing apparatus.

29. The computer program product of claim 28, wherein the computer readable program code for causing a computer to correct location coordinates of at least one processing module comprises:

computer readable program code for allowing a user to place a substrate at a known location in the at least one processing module;

computer readable program code for causing a computer to pick the substrate with the second substrate transport apparatus and convey the substrate to the substrate alignment apparatus;

computer readable program code for causing a computer to record a sixth misalignment of the substrate; and computer readable program code for causing a computer to calculate new location coordinates for the at least one processing module.

30. The computer program product of claim 29, wherein the computer readable program code for causing a computer to calculate new location coordinates for the at least one processing module comprises:

computer readable program code for causing a computer to retrieve previously stored location coordinates for the at least one processing module from a memory location if the sixth misalignment is more than or equal to a particular threshold;

computer readable program code for causing a computer to calculate new location coordinates for the at least one processing module utilizing the sixth misalignment;

computer readable program code for causing a computer to store the new location coordinates in the memory location; and computer readable program code for causing a computer to repeat the elements of claim 29.

31. The computer program product of claim 20, wherein the substrates being positioned are 200 mm or 300 mm semiconductor wafers.

* * * * *